(12) United States Patent
Hauffe et al.

(10) Patent No.: US 7,467,897 B2
(45) Date of Patent: Dec. 23, 2008

(54) LIGHT TRANSMITTING MODULES WITH OPTICAL POWER MONITORING

(75) Inventors: Ralf Hauffe, Berlin (DE); Arnd Kilian, Berlin (DE)

(73) Assignee: Hymite A/S, Kgs. Lyngby (DK)

( * ) Notice: Subject to any disclaimer, the term of this patent is extended or adjusted under 35 U.S.C. 154(b) by 0 days.

(21) Appl. No.: 11/566,448

(22) Filed: Dec. 4, 2006

(65) Prior Publication Data

US 2007/0091608 A1    Apr. 26, 2007

Related U.S. Application Data

(62) Division of application No. 10/777,583, filed on Feb. 12, 2004, now Pat. No. 7,165,896.

(51) Int. Cl.
  *G02B 6/42*    (2006.01)
(52) U.S. Cl. .............. 385/88; 385/92; 385/93; 385/94; 372/29.02; 372/33; 257/98
(58) Field of Classification Search ............... 385/88, 385/92, 93, 94; 372/29.02, 33; 257/98
See application file for complete search history.

(56) References Cited

U.S. PATENT DOCUMENTS

| | | | |
|---|---|---|---|
| 4,733,094 A | 3/1988 | Carpentier et al. | |
| 5,323,269 A | 6/1994 | Walker et al. | |
| 5,412,748 A * | 5/1995 | Furuyama et al. | 385/92 |
| 5,696,862 A | 12/1997 | Hauer et al. | |
| 5,737,348 A | 4/1998 | Smith | |
| 5,771,218 A | 6/1998 | Feldman et al. | |
| 5,997,185 A | 12/1999 | Kropp | |
| 6,069,905 A | 5/2000 | Davis et al. | |
| 6,314,223 B1 | 11/2001 | Te Kolste et al. | |
| 6,404,959 B1 | 6/2002 | Te Kolste et al. | |
| 6,591,043 B2 | 7/2003 | Te Kolste et al. | |
| 6,694,074 B2 | 2/2004 | Schunk | |
| 6,730,940 B1 | 5/2004 | Steranka et al. | |
| 6,835,923 B2 | 12/2004 | Hamalainen et al. | |
| 6,856,717 B2 | 2/2005 | Kilian | |
| 6,873,799 B2 | 3/2005 | Cohen et al. | |
| 6,881,980 B1 | 4/2005 | Ting | |
| 6,969,946 B2 | 11/2005 | Steranka et al. | |
| 6,973,110 B2 | 12/2005 | Althaus et al. | |
| 2002/0196500 A1 | 12/2002 | Cohen et al. | |
| 2003/0152336 A1 * | 8/2003 | Gurevich et al. | 385/88 |
| 2004/0071411 A1 | 4/2004 | Nakanishi et al. | |
| 2004/0190836 A1 | 9/2004 | Kilian | |
| 2004/0234270 A1 | 11/2004 | Nishie et al. | |

FOREIGN PATENT DOCUMENTS

| | | |
|---|---|---|
| EP | 0 786 838 A2 | 7/1997 |
| GB | 2 385 197 | 8/2003 |
| JP | 2000-77787 | 3/2000 |

* cited by examiner

*Primary Examiner*—James P Hughes
(74) *Attorney, Agent, or Firm*—Fish & Richardson P.C.

(57) ABSTRACT

An optical module, such as a package for a vertical cavity surface emitting laser diode (VCSEL) or other light emitting device, includes monitoring of the emitted optical power by tapping the transmitted beam. The module includes a substrate, which carries the light emitting device and an optical monitor. In addition, the module includes a transparent plate with at least two reflective regions that together redirect part of the light from the light emitting device to the optical monitor.

9 Claims, 10 Drawing Sheets

LIGHT TRANSMITTING MODULES WITH OPTICAL POWER MONITORING

CROSS-REFERENCE TO RELATED APPLICATION(S)

This application is a divisional of U.S. Ser. No. 10/777,583, filed Feb. 12, 2004

BACKGROUND

This disclosure relates to light transmitting modules with optical power monitoring.

In housings for light emitting devices, it sometimes is desirable to be able to monitor the emitted optical power. For certain devices, it is also desirable or necessary to draw the monitored power directly from the transmitted optical beam.

Several techniques have been suggested to realize housings for light sources with power monitoring obtained directly from the transmitted beam. However, sometimes it is difficult to achieve a design that does not overly restrict the possible positions of the radiation sensitive component relative to the light emitter and that can compensate for divergence angle changes. It also would be desirable to achieve a simple, inexpensive design to monitor the emitted optical power in a way that allows standard components to be used as monitoring receivers.

SUMMARY

The present invention relates to an optical module, such as a package for a vertical cavity surface emitting laser diode (VCSEL) or other light emitting device, that includes monitoring of the emitted optical power by tapping the light from the light emitting device.

The module may include a substrate that carries the light emitting device and an optical monitor. In addition, the module includes a transparent plate with at least two reflective regions that together redirect part of the light from the light emitting device to the optical monitor.

In one implementation, an optical module includes a substrate that carries a light emitting device and an optical monitor. The module includes a plate that is positioned in a path of light emitted by the light emitting device and that is transparent to light emitted by the light emitting device. Thus, light emitted by the light emitting device may be transmitted entirely the plate. The plate includes reflective regions, a first one of which is located to reflect some of the light emitted by the light emitting device and a second one of which is located to receive light reflected by the first reflective region and to direct the received light to the optical monitor.

In various implementations, one or more of the following features may be present. For example, the first and second reflective regions may be located on the same side of the plate and may be located, for example, on a side of the plate that is further from the light emitting device and the optical monitor. The first and second reflective regions may comprise grooves in a surface of the plate. The reflective regions may include angled facets that provide total internal reflection of light impinging on the facets. The first reflective region preferably is offset from an optical axis of the light emitting device. The plate also may include a focusing lens to focus light from the light emitting device that is transmitted through the plate. The focusing lens may be located on a same side of the plate as the first and second reflective regions.

The light emitting device and optical monitor may be mounted on the substrate or integrated into the substrate. The substrate may include a cavity within which the light emitting device and optical monitor are enclosed. In some implementations, the plate may be positioned over the cavity and may be sealed hermetically to the substrate. The substrate also may include hermetic, electrical feed throughs to the light emitting device and optical monitor.

According to another aspect, an optical assembly includes an optical module comprising a housing in which a light emitting device and an optical monitor are mounted. The assembly also includes a multi-functional piece having a cavity to receive the optical module, a first reflective surface to reflect light from the light emitting device in a direction substantially perpendicular to a direction of light emitted by the light emitting device, and a second reflective surface to reflect some of the light from the first reflective surface to the optical monitor.

The light emitting device and the optical monitor may be hermetically sealed in the optical module. In some implementations, the multi-functional piece may include a receptacle for an optical fiber ferrule. A fiber may be positioned in the receptacle to receive at least some of the light reflected by the first reflective surface and not subsequently reflected by the second reflective surface. The second reflective surface may be positioned to reflect light from the first reflective surface in a direction substantially perpendicular to a direction of light reflected by the first reflective surface.

Methods for monitoring light from a solid state device also are described.

Advantages that may be obtained in some implementations include the following. For example, additional parts may not be required to obtain the power monitoring because the reflectors can be integrated into components that already are required (e.g., lens plates or sealing lids). Processing of the reflectors may be simplified because only surface structuring on a single surface is required for many implementations, and the deposition of additional reflective materials can be avoided in some cases.

The optical modules and assemblies described here can help improve achieving monitored power with low aberration of the transmitted beam and can help compensate for divergence angle fluctuations. Furthermore, the modules may provide greater flexibility in the placement of the monitoring receiver with a small distance between the reflector plate and the light emitter.

Other features and advantages will be readily apparent from the following detailed description, the accompanying drawings and the claims.

DETAILED DESCRIPTION

Figure 1:
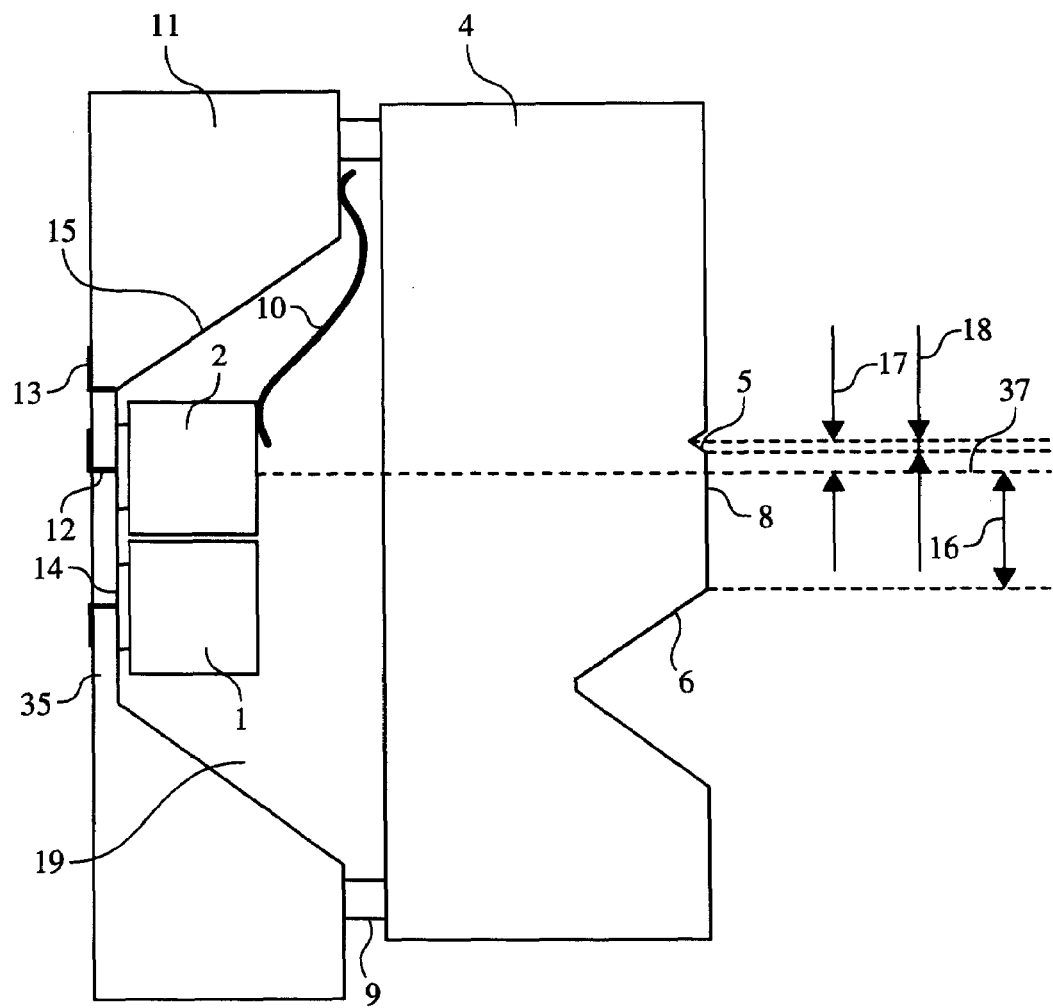
FIG. 1 illustrates a housing for a light emitting device and an optical power monitor according to one implementation of the invention.

As shown in FIG. 1, a light transmitting module includes a housing for a light emitting device, such as a vertical cavity surface emitting laser diode (VCSEL) 2. Other semiconductor or solid state light emitting devices may be used as well. The housing includes a substrate 11, which, in the illustrated implementation, serves as a sub-mount for the light emitting device 2, and an optical monitor 1 with a radiation sensitive area. In other implementations, the light emitting device and monitor may be integrated directly into the substrate. The optical monitor may be integrated, for example, into the same substrate that carries the light emitting device.

In FIG. 1, the housing also includes a sealing plate 4 that is transparent to light emitted by the light emitting device 2 and that includes at least two reflective regions that together redirect some of the transmitted light back onto the optical monitor 1. As shown in FIG. 1, the plate 4 includes reflective surfaces 5, 6 and 8. In the illustrated implementation (see FIGS. 1 and 2), the reflective regions are formed by facets or grooves 20, 21 provided in the same surface of the plate 4, which may be hermetically sealed to the substrate 11.

In the implementation of FIG. 1, instead of directly redirecting the reflected light onto the monitoring receiver 1, the first reflective surface 5 directs the light in an approximately perpendicular direction to the original beam. Therefore the size, position and shape of the first reflective surface may be chosen to optimize the monitored power and to minimize the dependence of the monitored power on divergence angle fluctuations of the emitted beam. The second reflective surface 6 directs the radiation from the first reflective surface 5 back toward the sub-mount and to the monitoring receiver 1. The reflective surface 6 may be shaped to provide some focusing capability.

With reference to FIG. 1, some of the light rays emitted from the source 2 propagate close to the optical axis 37, travel substantially straight through the transparent plate 4 and exit the plate at the straight outer surface 8, preferably with low reflection losses. The outer surface 8 of the plate 4, which may be made, for example, of silicon or glass, may include an anti-reflection coating to help reduce such losses.

Figure 2:
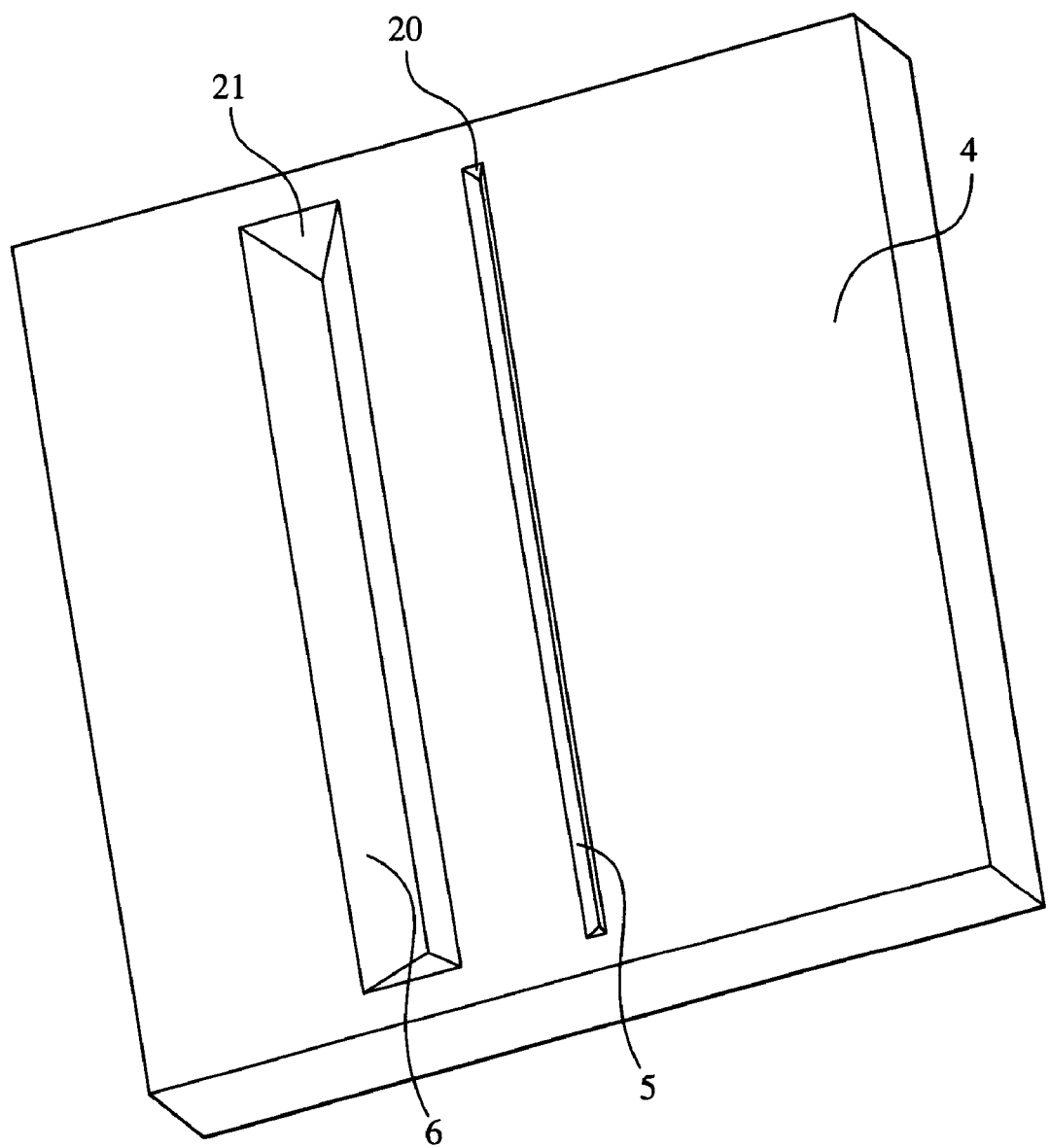
FIG. 2 illustrates an example of a sealing plate with reflective surfaces for the housing of FIG. 1.
Figure 3:
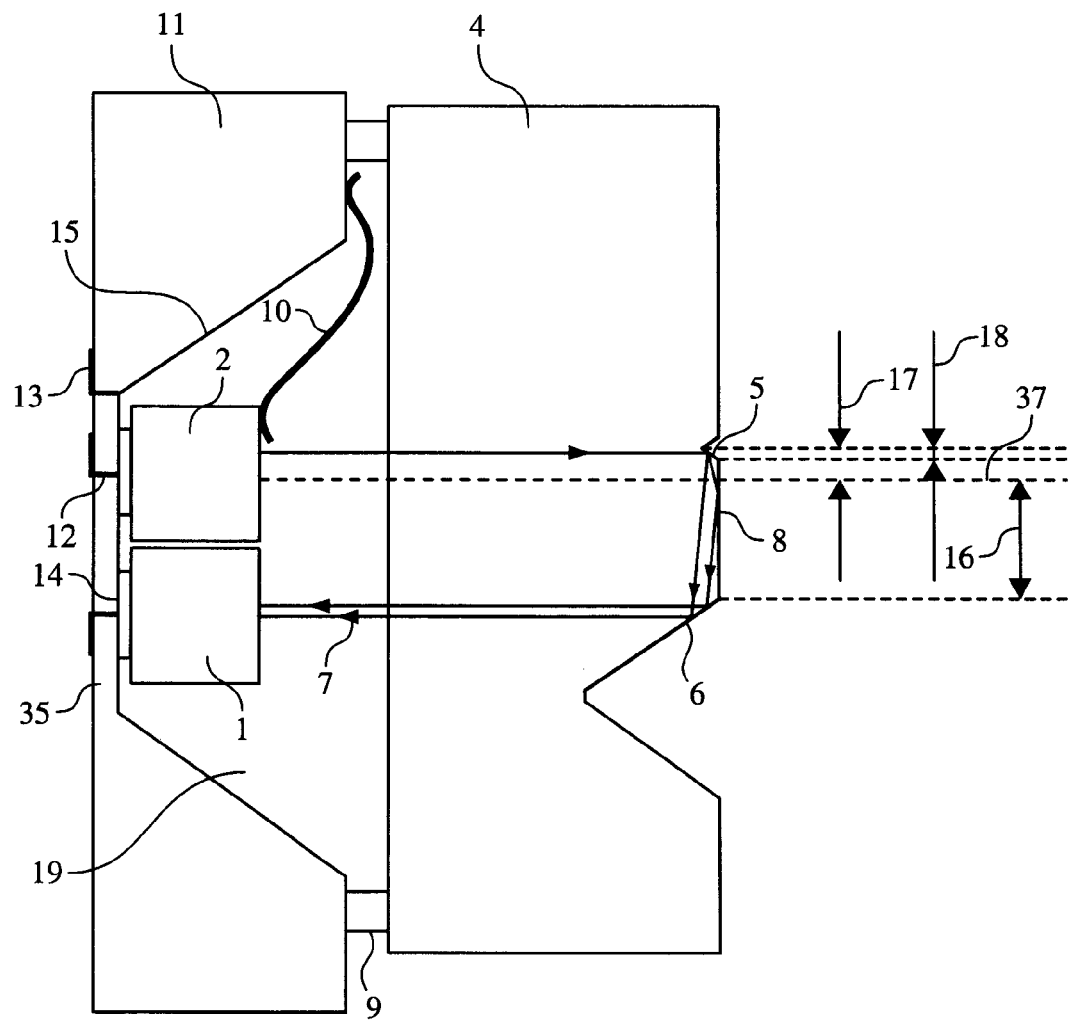
FIG. 3 illustrates optical paths for the monitored light in the housing of FIG. 1.

The distance between the first reflective surface 5 and the optical axis 37 is indicated by arrows 17, and the size of the reflective region is indicated by arrows 18. As illustrated by FIG. 3, some light rays that are offset from the optical axis 37 strike the reflective surface 5 and are internally reflected. The reflected rays subsequently strike the second reflective surface 6, in some cases after being reflected from the outer surface 8 of the plate 4 as a result of the shallow incident angle. The second reflective surface 6 directs at least some of the light rays 7 toward the monitoring detector 1. A reflector design capable of compensating for divergence angle changes can be realized by properly choosing the size 18 and position 17 of the reflective surface 5. The position of the second reflective surface 6 (indicated by the arrows 16) can be chosen for optimum coupling to the receiver device 1 on the substrate 11. Although the implementation of FIGS. 1-3 shows the grooves 20, 21 for the reflective surfaces 5, 6 in the exterior surface of the plate 4, in other implementations the reflective surfaces for directing light back to the monitor 1 may be provided at an inner surface of the plate (i.e., the surface closer to the device 2 and the monitor 1).

The substrate 11 may include, for example, double-layer silicon on an insulator. A wet etching technique may be used to form a groove or other cavity 19 in which the light emitting device 2 and optical monitor 1 are to be mounted. Wet etching also may be used to provide hermetic, electrical feed throughs 12. Slanted sidewalls are preferred to allow for the use of lithography. If different materials, such as glass or ceramic, are used for the substrate 11, then other techniques may be employed to form the groove and feed throughs. Metal subsequently may be deposited to seal the feed throughs 12 hermetically and to form electrical lines 15 and pads 13. The emitter 2 and the receiver 1 then are soldered or otherwise bonded to the membrane 35. Optionally, electrical contacts may be provided by bond pads 14 below the device 2 and monitor 1. Additional electrical contacts 10 may be formed by bond wires from the devices 1, 2 to the upper edge of the groove 19. If silicon (e.g., a (100) wafer) is used for the sealing plate 4, the reflective surfaces 5, 6 may be formed, for example, by a wet etch of V-grooves 20 and 21, as shown in FIG. 2. In the case of wet-etched crystalline plates, the angle of the reflective surfaces is determined by the crystal planes.

Figure 4:
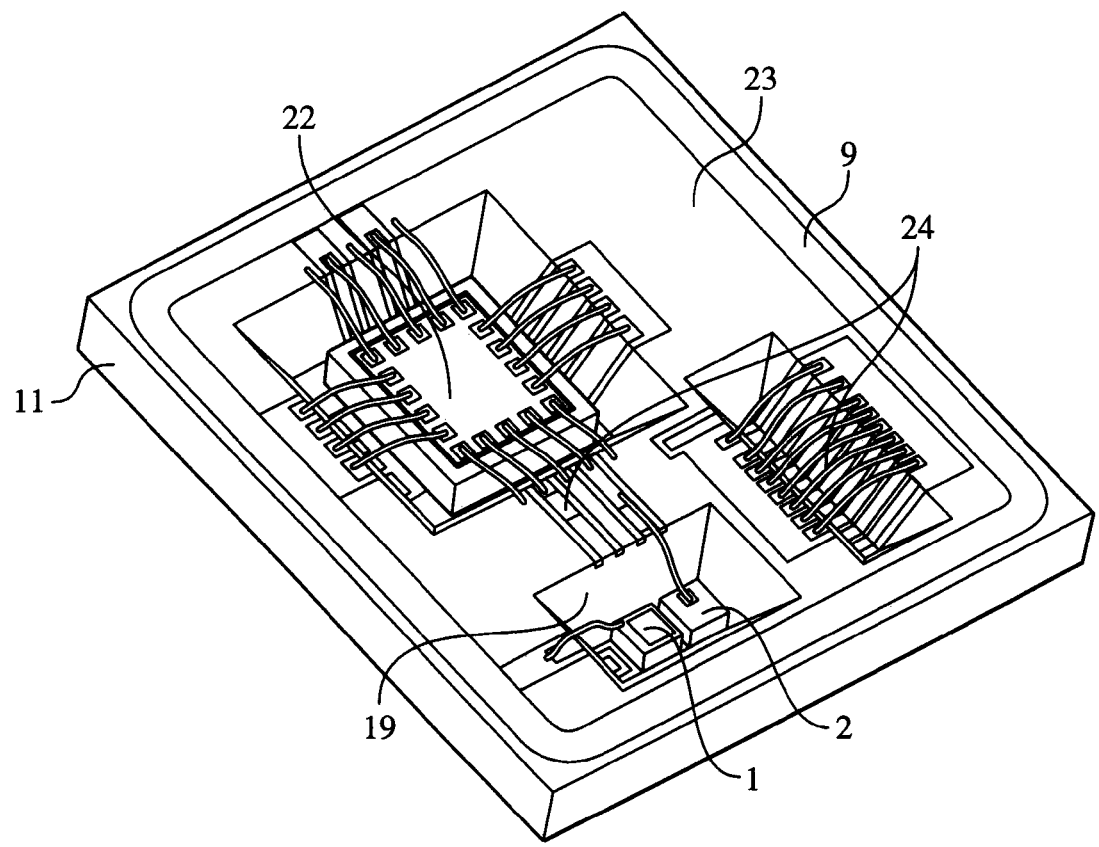
FIG. 4 illustrates a sub-mount for a light emitting device, an optical monitor and other components.

As shown in FIG. 4, the substrate 11 also may include additional cavities for other active and passive components, such as a driver chip 22 for the laser 2, and inductive coils 24. Those components, as well as others such as capacitors, can share a common package ground 23. The cavities on the substrate may be sealed hermetically, individually by single lids or together by a large lid. The hermetic seal may be provided, for example, by using a solder sealing-ring deposited either on the lid or the substrate.

Figure 5:
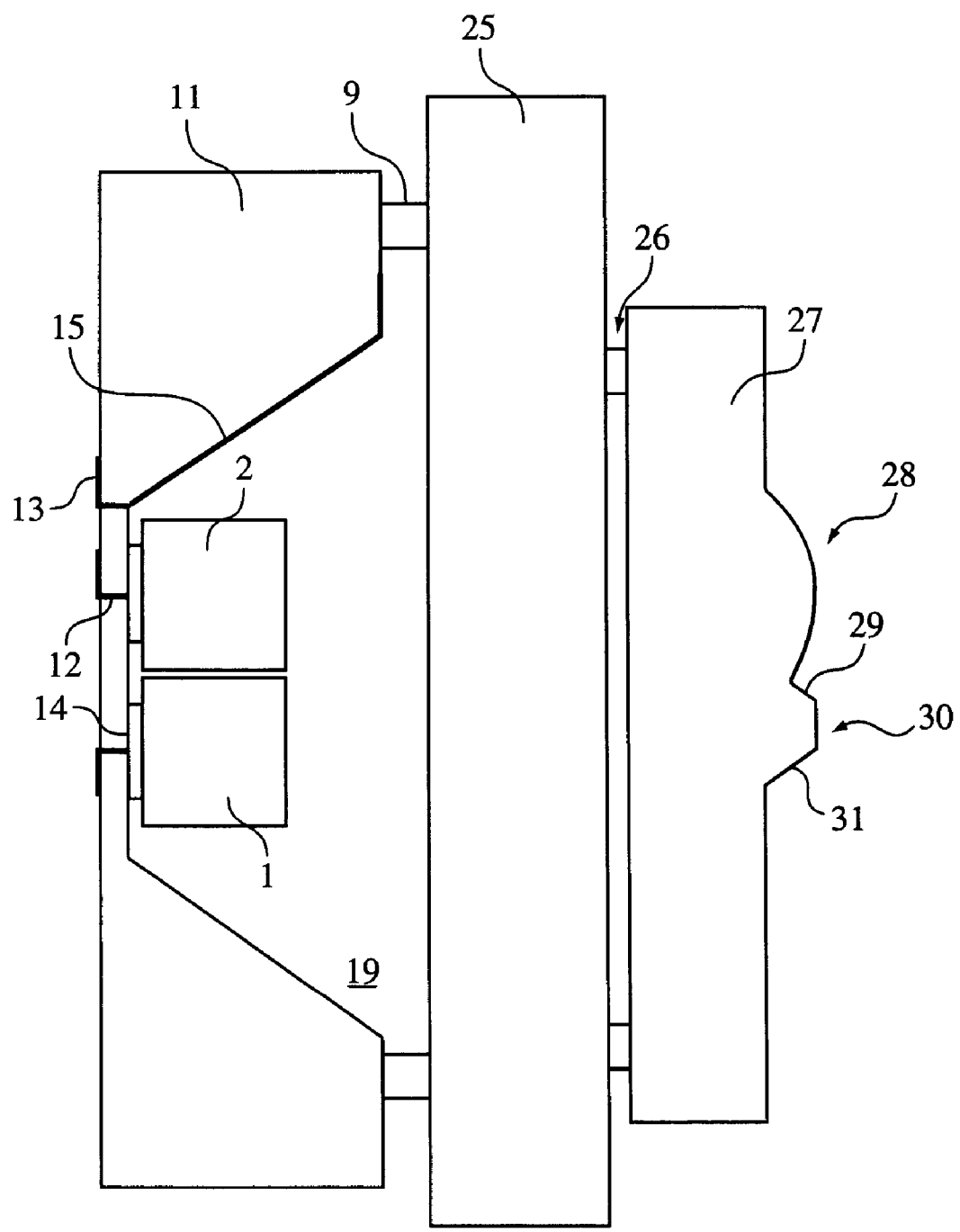
FIG. 5 illustrates an assembly according to another implementation of the invention with reflective surfaces integrated into a lens plate atop a sealed hermetic housing.
Figure 6:
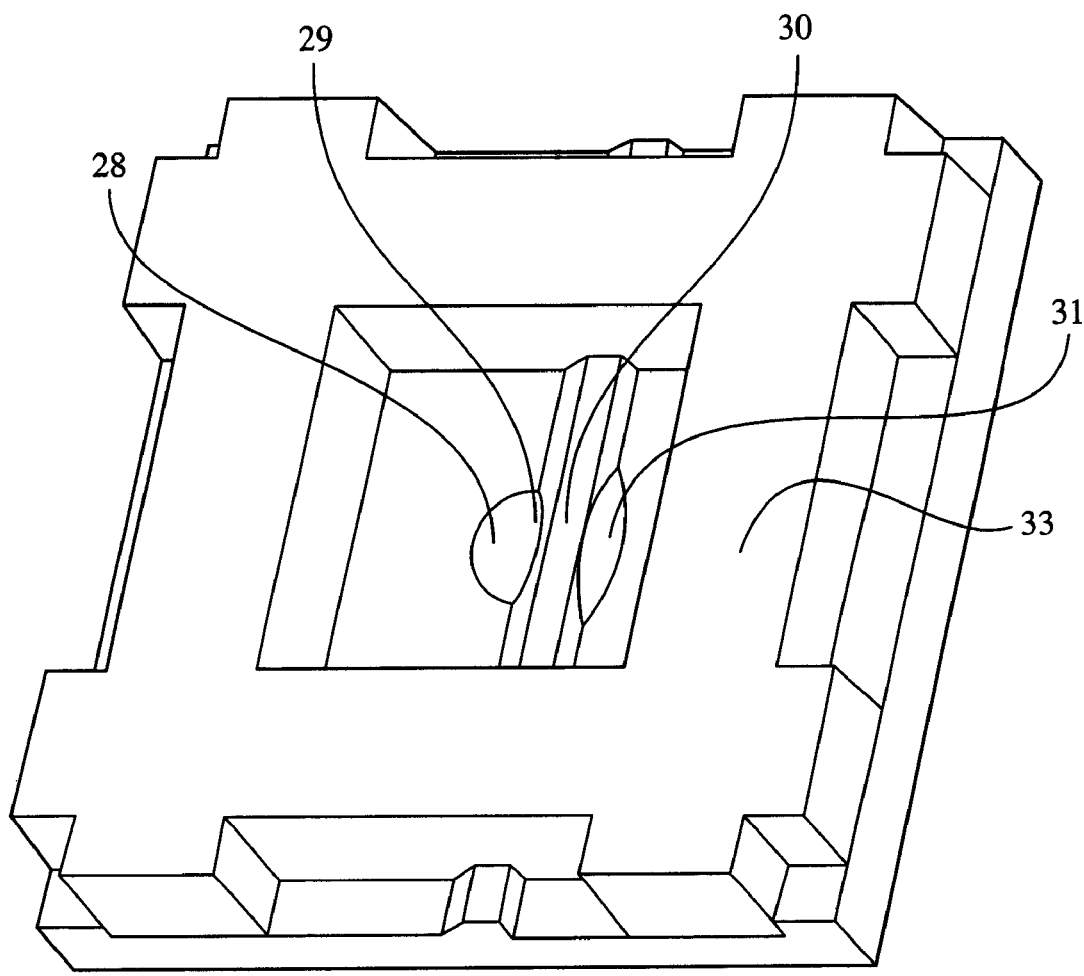
FIG. 6 illustrates an example of a lens plate for the assembly of FIG. 5.

A second implementation is illustrated in FIGS. 5 and 6 and includes a housing for a light emitting device 2 and an optical monitor 1 mounted on a substrate 11. The cavity 19 in which the light emitting device 2 and optical monitor 1 are located may be sealed hermetically by a first (sealing) plate 25, which is transparent to light emitted by the device 2. A second (reflector) plate 27, which also is transparent to light emitted by the device 2, includes reflective surfaces 29, 30 and 31 to redirect light emitted from the device 2 back to the monitor 1. The second plate 27 is mounted to the first plate 25. The reflective surfaces 29, 30, and 31 function in a manner similar to the surfaces 5, 8 and 6 described above in connection with FIG. 1. In particular, some light rays that are offset from the optical axis of the light emitting device 2 strike the first reflective surface 29 and are internally reflected. The reflected rays subsequently strike the second reflective surface 31, in some cases after being reflected from the outer surface 30 of the plate 27 as a result of the shallow incident angle. The second reflective surface 31 directs at least some of the light rays toward the monitoring detector 1.

The second reflective surface 31 may be curved to help focus the light at the optical monitor 1. Alignment marks 33 (FIG. 6) for fiber receptacles also may be added to the external reflector plate 27, which may be molded, for example, from plastic, glass or other surface-machined materials. The plate 27 also may include an imaging lens 28 to focus the transmitted radiation.

Figure 7:
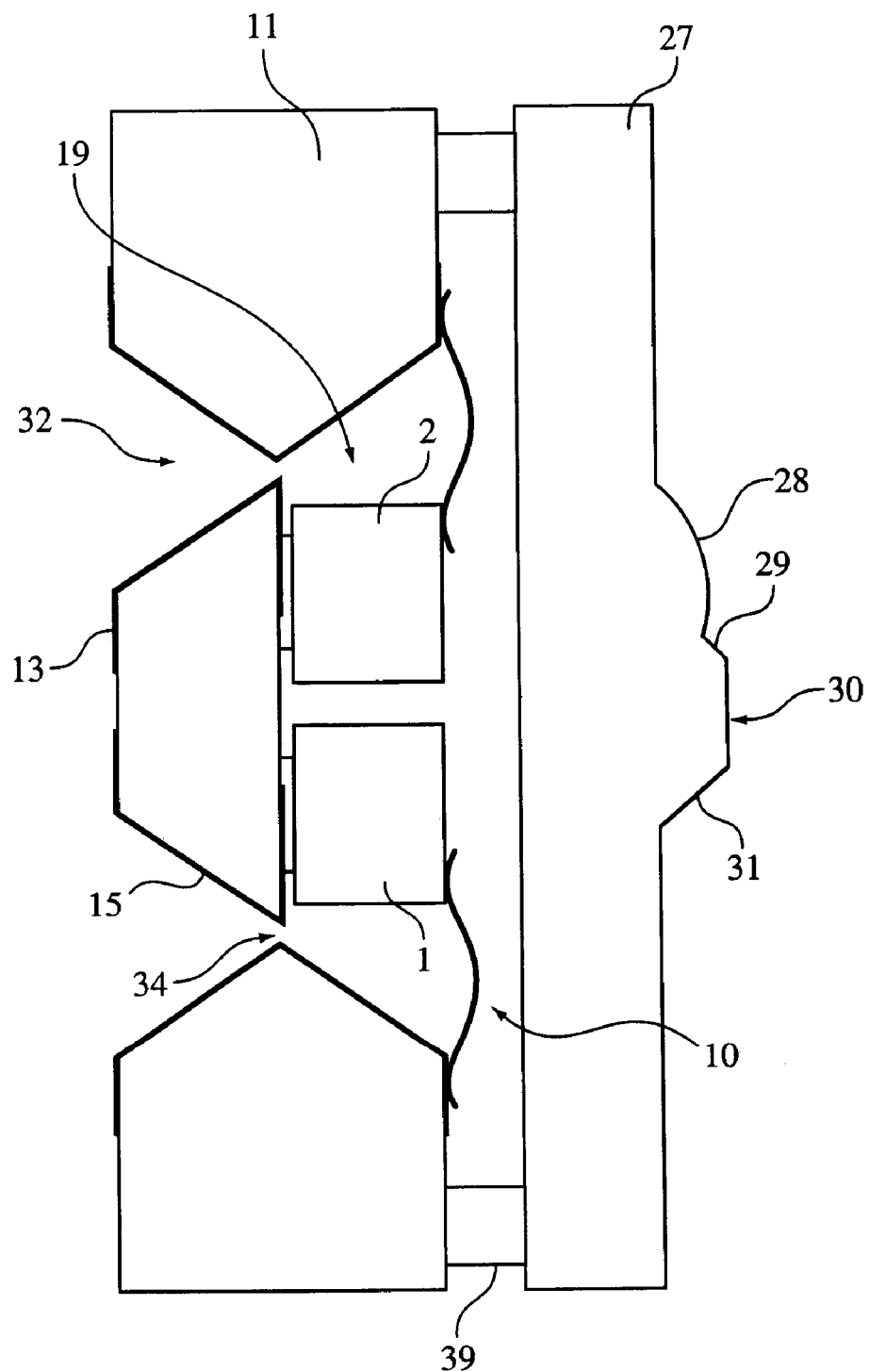
FIG. 7 illustrates an implementation of a non-hermetic housing according to the invention.
Figure 8:
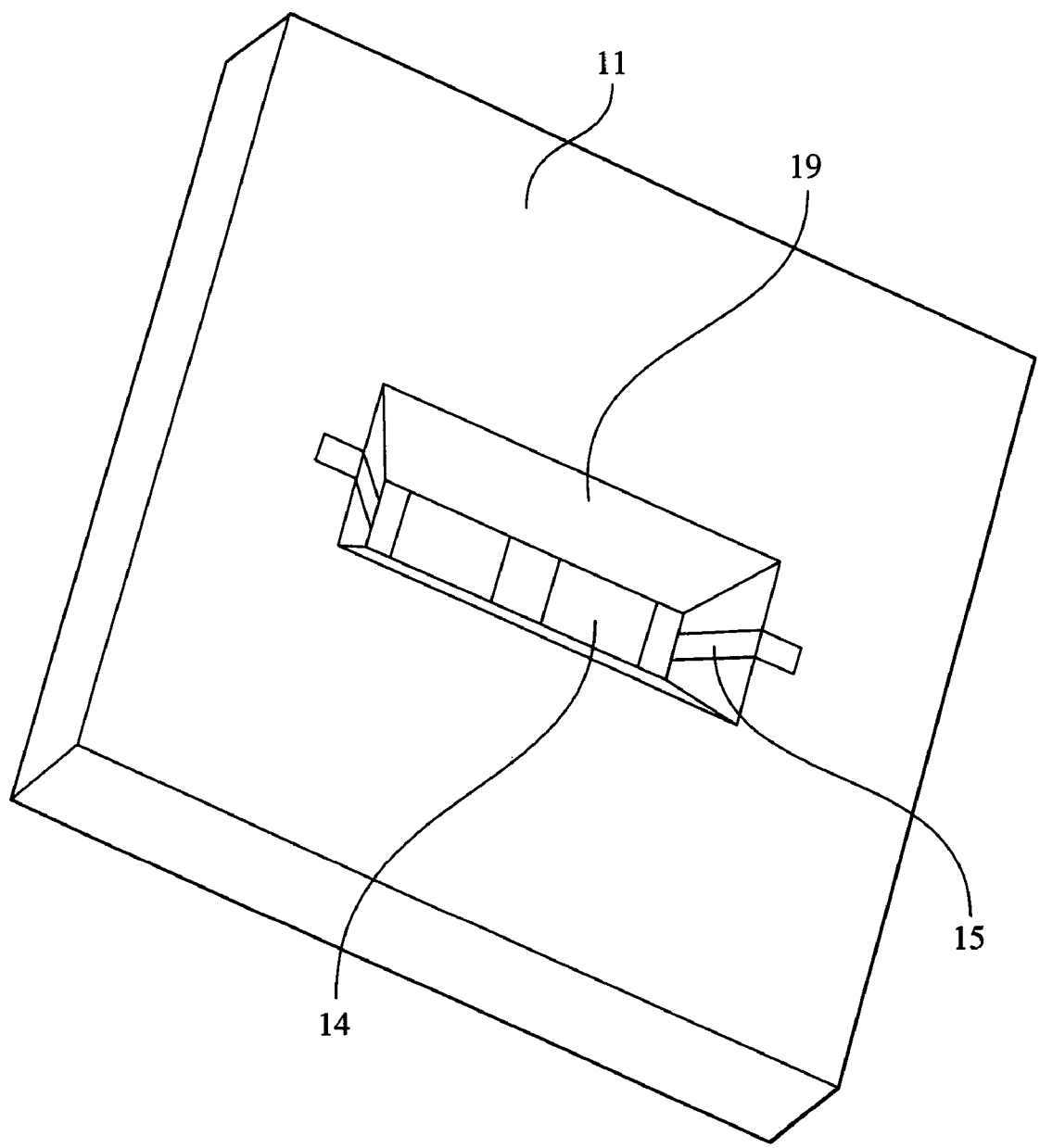
FIGS. 8 and 9 illustrate front and back views, respectively, of the non-hermetic sub-mount.
Figure 9:
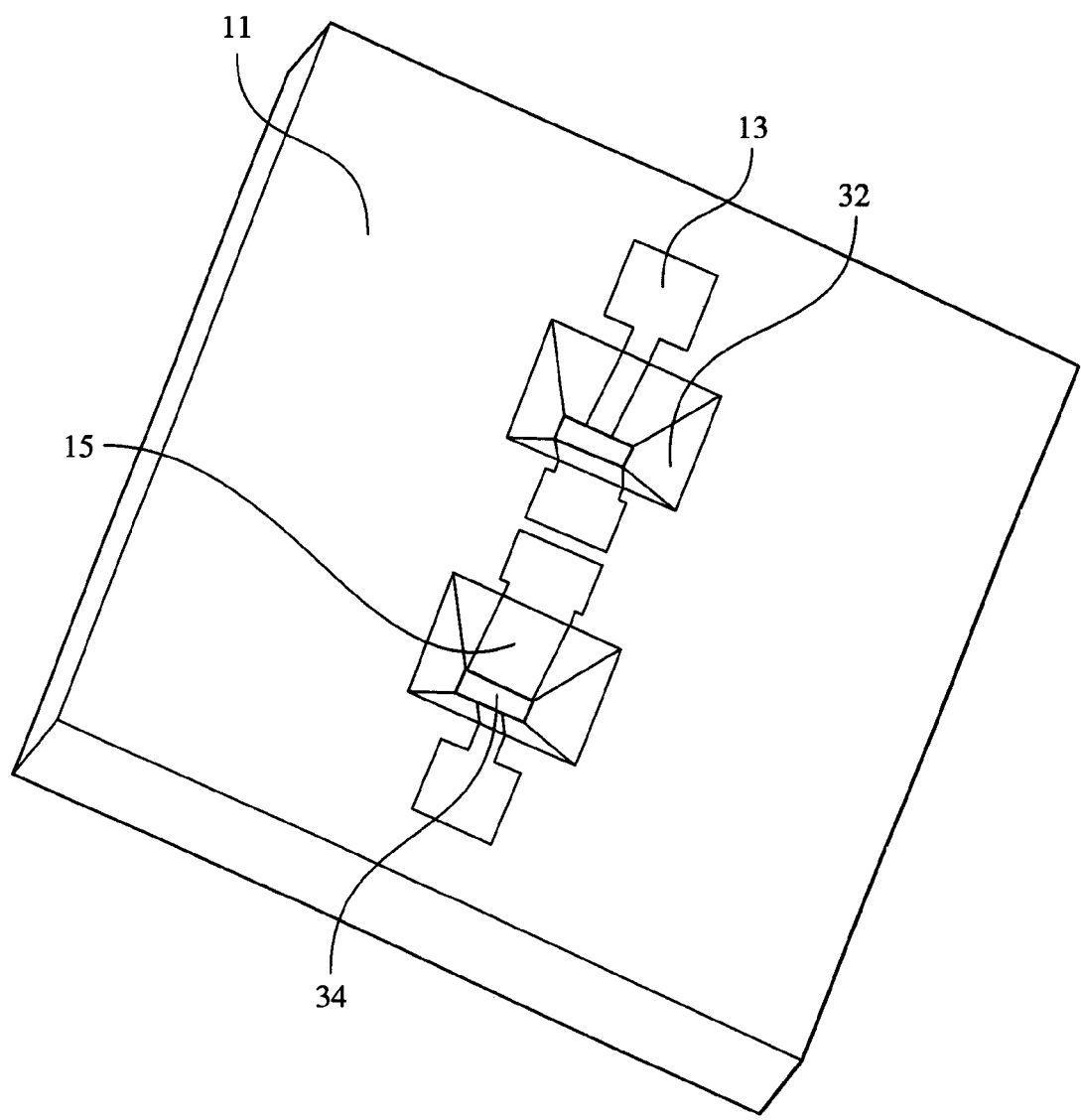

According to another implementation illustrated in FIGS. 7, 8 and 9, the reflector plate 27 may be mounted on a non-hermetic sub-mount without the addition of a separate sealing plate 25 as used in the implementation of FIG. 5. The reflector plate 27 in FIG. 7 is similar to the one described above in connection with FIG. 5, but may include additional standoffs 39. If the substrate 11 comprises silicon, then etching can be performed simultaneously from both sides to create the front side cavity 19, two back side cavities 32, and through holes 34. Further processing of the sub-mount may be performed as described above in connection with FIG. 1.

The use of two or more reflective surfaces can allow for a wide range of monitored power levels and for compensation of variations in the monitored power resulting from fluctuations in the beam divergence angle. It also allows for flexibility in placement of the radiation sensitive element 1 relative to the light emitting element 2.

Fabrication of the reflectors can be relatively simple. If the incident angles of radiation rays on the reflective areas are on the order of 45° or less, it is possible, for many plate materials (e.g., silicon, glass, polymers) to employ total internal reflection for redirecting the light (assuming the beam originates from the medium with the higher refractive index). For some implementations, that may eliminate the need to deposit reflective materials on the surfaces of the angled facets, although that still may be done. The power monitoring techniques may be used in both single-mode and multi-mode applications, with the monitored power drawn directly from the transmitted optical beam.

Although the plates (i.e., sealing plates and reflector plates) are transparent to light emitted by the light emitting device 2, the plates need not be transparent to all wavelengths of light emitted by the device. The plates should be transparent at least to the wavelength(s) of interest, in other words, the wavelengths that are to be transmitted through the plates to the outside and that are to be monitored by the optical monitor 1. Of course, in some implementations, the plates may be transparent to all (or substantially all) wavelengths of light emitted by the light emitting device 2.

In certain applications, it may be desirable to redirect and transmit the light beam in the horizontal direction, rather than vertically out of the package. This can be achieved, for example, by a multi-functional part that combines the functionality of a receptacle for a fiber ferrule, imaging of the optical beam through one or more lenses, redirection of the light by 90°, and power monitoring. The multi-functional piece 40 may be made, for example, from molded plastic. Alternatively, the piece 40 may be machined using other materials.

Figure 10:
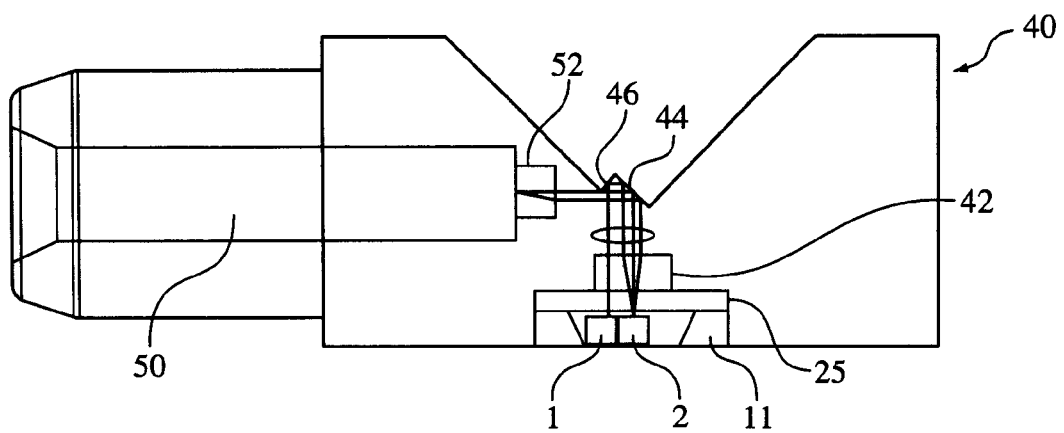
FIGS. 10 and 11 illustrate an implementation which allows the light to be transmitted horizontally out of the package.
Figure 11:
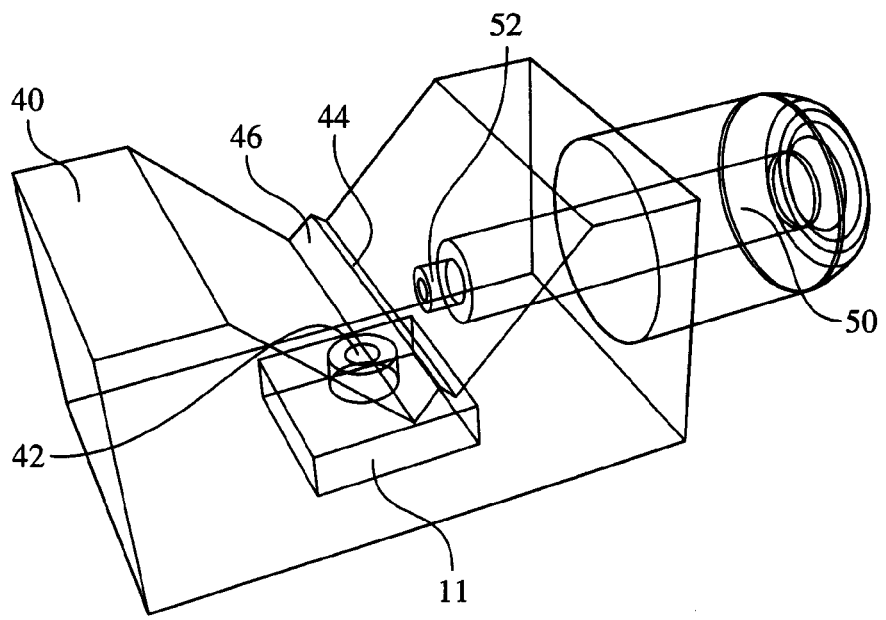

An example of such a multi-functional part 40 is shown in FIGS. 10 and 11. The part 40 includes a cavity to receive an optical module that includes a hermetically sealed housing in which a light emitting device 2 and optical monitor 1 are encapsulated. As in the implementations described above, the light emitting device and optical monitor may be mounted on a substrate 11 that includes externally accessible electrical contacts (not shown in FIGS. 10 and 11). The device 2 emits light in the vertical direction. The optical module also includes a cover, such as plate 25, that is transparent to light emitted by the device 2. A lens 42 may be provided as part of the optical module to collimate the light beam from the device 2.

The multi-functional part 40 includes at least two reflective surfaces 44, 46 to redirect some or all of the light from the device 2. The reflective surfaces may comprise, for example, grooves or facets. The first reflective surface 44 is positioned so as to intercept light from the device 2 and to redirect the light at about a 90° angle. The light reflected by the first surface 44 is partially intercepted and redirected by the second surface 46 toward the optical monitor 1. Some of the light reflected by the first surface 44 travels in the horizontal direction and may be coupled, for example, to an optical fiber (not shown). In the illustrated implementation, the part 40 also includes a receptacle 50 for a fiber ferrule. A lens surface 52 may be provided to focus light onto the fiber.

Other implementations are within the scope of the claims.

What is claimed is:

1. An optical assembly comprising:
an optical module comprising a housing in which a light emitting device and an optical monitor are mounted;
a multi-functional piece comprising:
a cavity to receive the optical module; and
a first reflective surface to reflect light from the light emitting device in a direction substantially perpendicular to a direction of light emitted by the light emitting device such that some of the light reflected by the first reflective surface is received by an optical component with an optical axis aligned substantially along the perpendicular direction; and
a second reflective surface to reflect some of the light from the first reflective surface to the optical monitor.

2. The optical assembly of claim 1 wherein the multi-functional piece includes a receptacle for an optical fiber ferrule to facilitate positioning of a fiber to receive at least some of the light reflected by the first reflective surface and not subsequently reflected by the second reflective surface.

3. The optical assembly of claim 1 wherein the second reflective surface is positioned to reflect light from the first reflective surface in a direction substantially perpendicular to a direction of light reflected by the first reflective surface.

4. The optical assembly of claim 3 wherein the light emitting device and the optical monitor are hermetically sealed in the optical module.

5. The optical assembly of claim 1 wherein the optical component comprises an optical fiber.

6. The optical assembly of claim 1 wherein the first reflective surface comprises a groove or facet.

7. The optical assembly of claim 6 wherein the second reflective surface comprises a groove or facet.

8. The optical assembly of claim 7 wherein the multi-functional piece is composed of plastic.

9. The optical assembly of claim 1 wherein the light emitting device is a semiconductor laser diode.

\* \* \* \* \*